United States Patent
Sirinorakul et al.

(10) Patent No.: US 10,361,146 B2
(45) Date of Patent: Jul. 23, 2019

(54) SEMICONDUCTOR PACKAGE WITH MULTIPLE STACKED LEADFRAMES AND A METHOD OF MANUFACTURING THE SAME

(71) Applicant: UTAC Headquarters PTE. LTD., Singapore (SG)

(72) Inventors: Saravuth Sirinorakul, Bangkok (TH); Keith M. Edwards, Chandler, AZ (US); Suebphong Yenrudee, Bangkok (TH); Albert Loh, Fremont, CA (US)

(73) Assignee: UTAC Headquarters PTE, LTD., Singapore (SG)

( * ) Notice: Subject to any disclaimer, the term of this patent is extended or adjusted under 35 U.S.C. 154(b) by 0 days.

(21) Appl. No.: 16/243,972

(22) Filed: Jan. 9, 2019

(65) Prior Publication Data

US 2019/0181077 A1    Jun. 13, 2019

Related U.S. Application Data

(62) Division of application No. 15/590,878, filed on May 9, 2017.

(60) Provisional application No. 62/339,731, filed on May 20, 2016.

(51) Int. Cl.
| | |
|---|---|
| *H01L 21/00* | (2006.01) |
| *H01L 23/495* | (2006.01) |
| *H01L 23/31* | (2006.01) |
| *H01L 21/78* | (2006.01) |
| *H01L 21/48* | (2006.01) |

(52) U.S. Cl.
CPC ........ *H01L 23/49537* (2013.01); *H01L 21/78* (2013.01); *H01L 23/3135* (2013.01); *H01L 23/49582* (2013.01); *H01L 21/4825* (2013.01); *H01L 21/4828* (2013.01); *H01L 21/4857* (2013.01); *H01L 23/49534* (2013.01)

(58) Field of Classification Search
CPC ............ H01L 21/4825; H01L 21/4828; H01L 21/4857; H01L 23/49534; H01L 23/49575
See application file for complete search history.

(56) References Cited

U.S. PATENT DOCUMENTS

| | | | | |
|---|---|---|---|---|
| 6,812,552 | B2* | 11/2004 | Islam | H01L 21/4832 257/666 |
| 8,623,708 | B1* | 1/2014 | Do | H01L 23/4952 257/666 |
| 8,736,065 | B2* | 5/2014 | Gonzalez | H01L 24/19 257/686 |
| 2016/0148904 | A1* | 5/2016 | Zhai | H01L 21/4853 257/777 |

* cited by examiner

*Primary Examiner* — Nicholas J Tobergte
(74) *Attorney, Agent, or Firm* — Haverstock & Owens LLP

(57) ABSTRACT

Embodiments of the present invention are directed to a method of manufacturing a semiconductor package with an internal routing circuit. The internal routing circuit is formed from multiple leadframe routing layers in a plated and etched copper terminal semiconductor package by removing unwanted areas of each leadframe to create conductive paths on an associated leadframe layer of the semiconductor package.

14 Claims, 16 Drawing Sheets

Bottom View of 1st leadframe for Terminal of Package

Top View of 1st leadframe for Terminal of Package

Top View 2nd Leadframe

Top View 3rd Leadframe

Bottom View 3rd Leadframe

SEMICONDUCTOR PACKAGE WITH MULTIPLE STACKED LEADFRAMES AND A METHOD OF MANUFACTURING THE SAME

RELATED APPLICATIONS

This application is a divisional application which claims priority under 35 U.S.C. 121 of the co-pending U.S. patent application Ser. No. 15/590,878, filed May 9, 2017, entitled "A Semiconductor Package with Multiple Stacked Leadframes and a Method of Manufacturing the Same," which in turn claims benefit of priority under 35 U.S.C. section 119(e) of the U.S. Provisional Patent Application Ser. No. 62/339,731, filed May 20, 2016, entitled "Semiconductor Package with Multi Stacked Leadframes," which are hereby incorporated by reference in their entirety.

FIELD OF INVENTION

The present invention is related to the field of semiconductor package manufacturing. More specifically, the present invention relates to a semiconductor package with an internal routing circuit formed from multiple leadframe routing layers in the package.

BACKGROUND OF THE INVENTION

There is a growing demand for high-performance semiconductor packages. However, increases in semiconductor circuit density pose interconnect challenges for a packaged chip's thermal, mechanical and electrical integrity. Thus, there is a need for a method of manufacturing a semiconductor package with improved routing capabilities.

BRIEF SUMMARY OF THE INVENTION

Embodiments of the present invention are directed to a method of manufacturing a semiconductor package with an internal routing circuit. The internal routing circuit is formed from multiple leadframe routing layers in a plated and etched copper terminal semiconductor package by removing unwanted areas of each leadframe to create conductive paths on an associated leadframe layer of the semiconductor package.

In one aspect, a semiconductor package is provided. The semiconductor package includes package terminals at a bottom side of the semiconductor package, and a plurality of copper leadframe routing layers, including a base copper leadframe routing layer and a top copper leadframe routing layer, within the semiconductor package.

The base copper leadframe routing layer includes base copper routing circuits. The base copper leadframe routing layer is a base copper leadframe that is partially etched on a first side on the base copper leadframe to form the base copper routing circuits, and is plated on a second side of the base copper leadframe to form the package terminals.

The top copper leadframe routing layer includes top copper routing circuits. The top copper leadframe routing layer is a top copper leadframe that is etched-thru to form the top copper routing circuits. In some embodiments, the top copper leadframe includes steps formed on a bottom side of the top copper leadframe.

In some embodiments, the copper routing circuits associated with each routing layer is structured differently from the routing circuits associated with other routing layers.

The plurality of copper leadframe routing layers can also include at least one intermediary copper leadframe routing layer. Each of the at least one intermediary copper leadframe routing layer is an intermediary copper leadframe that is etch-thru to form intermediary copper routing circuits. In some embodiments, each of the at least one intermediary copper leadframe includes steps formed on a bottom side of the intermediary copper leadframe.

The semiconductor package also includes a die coupled with the top copper leadframe routing layer, a first insulation layer encapsulating the die and top copper leadframe routing layer and all intermediary copper leadframe routing layer, if any, and a second insulation layer encapsulating the base copper leadframe routing layer, wherein the package terminals are exposed at and flush with a bottom of the second insulation layer.

In some embodiments, each of the top copper leadframe routing layer and the intermediary copper leadframe routing layers, if any, further includes tie bars extending from corresponding copper routing circuits associated with the routing layer. The tie bars are exposed at and flush with sides of the first insulation layer.

The semiconductor package includes an internal routing circuit from die terminals on the die to the package terminals. The internal routing circuit is formed by all the routing layers in the semiconductor package.

In another aspect, a method of manufacturing semiconductor devices that includes a plurality of conductive routing layers is provided.

In another aspect, a method of manufacturing semiconductor devices that includes a plurality of conductive routing layers is provided. The method includes obtaining an etched and plated base leadframe that includes a plurality of base copper routing circuits and a plurality of package terminals. The plurality of base copper routing circuits forms a base copper leadframe routing layer.

In some embodiments, the etched and plated base leadframe is obtained by partially etching a base copper substrate to form the plurality of base copper routing circuits at a top surface of the base copper substrate, and plating a plurality of areas on surfaces of the base copper substrate, thereby resulting in the etched and plated base leadframe. The plurality of areas includes bottom plated areas that eventually form the plurality of package terminals and also includes top plated areas.

The method also includes obtaining an etched and plated top leadframe that includes a plurality of top copper routing circuits. The plurality of top copper routing circuits forms a top copper leadframe routing layer.

In some embodiments, the etched and plated top leadframe is obtained by fully etching a top copper substrate to form the plurality of top copper routing circuits and tie bars, wherein the plurality of top copper routing circuits is suspended by the tie bars, and plating a plurality of areas on surfaces of the top copper substrate, thereby resulting in the etched and plated top leadframe. The plurality of areas includes bottom plated areas and top plated areas that are on opposite sides of the top copper substrate. The bottom plated areas of the top copper substrate are configured to interface with top plated areas of a leadframe directly beneath the etched and plated top leadframe, and the top plated areas of the top copper substrate are configured to couple with the plurality of dies.

The method also includes forming an electrical communication between the base copper leadframe routing layer and the top copper leadframe routing layer.

In some embodiments, the method also includes, prior to forming an electrical communication between the base copper leadframe routing layer and the top copper leadframe routing layer, obtaining an etched and plated intermediary leadframe that includes a plurality of intermediary copper routing circuits, wherein the plurality of intermediary copper routing circuits forms an intermediary copper leadframe routing layer, and forming an electrical communication between the base copper leadframe routing layer and the intermediary copper leadframe routing layer.

In some embodiments, the etched and plated intermediary leadframe is obtained by fully etching an intermediary copper substrate to form the plurality of intermediary copper routing circuits and tie bars, wherein the plurality of intermediary copper routing circuits is suspended by the tie bars, and plating a plurality of areas on surfaces of the intermediary copper substrate, thereby resulting in the etched and plated intermediary leadframe. The plurality of areas includes bottom plated areas and top plated areas that are on opposite sides of the intermediary copper substrate. The bottom plated areas of the intermediary copper substrate are configured to interface with top plated areas of a leadframe directly beneath the etched and plated intermediary leadframe, and the top plated areas of the intermediary copper substrate are configured to couple with bottom plated areas of a leadframe directly above the etched and plated intermediary leadframe.

The electrical connections between the routing layers can be formed using material, wherein the material is solder paste or sintering epoxy. Alternatively, the electrical connections between the routing layers can be formed by performing a spot welding process.

The method also includes coupling a plurality of dies with the top copper leadframe routing layer and encapsulating the plurality of dies and the top copper leadframe routing layer with a first insulation layer. In some embodiments, the first insulation layer also encapsulates the intermediary copper leadframe routing layer.

The method also includes etching away exposed copper at the bottom of the base leadframe, thereby isolating the plurality of package terminals and exposing the plurality of base copper routing circuits at the bottom of the base leadframe.

The method also includes encapsulating the plurality of exposed copper routing circuits at the bottom of the base leadframe with a second insulation layer, and performing a cut-through procedure to singulate the semiconductor packages from each other.

In yet another aspect, a method of manufacturing semiconductor devices that each includes a plurality of conductive routing layers. The method includes obtaining a plurality of etched leadframes, wherein each of the etched leadframes includes a plurality of routing circuits that forms a leadframe routing layer. The method also includes stacking the plurality of etched leadframes, thereby forming an internal routing circuit from all leadframe routing layers. The method also includes coupling a plurality of dies with the topmost leadframe routing layer of the stack, and encapsulating the plurality of dies and all leadframe routing layers, except the bottommost leadframe routing layer of the stack, with a first insulation layer. The method also includes removing exposed copper at the bottom of the stack, thereby isolating a plurality of package terminals and exposing a plurality of copper routing circuits at the bottom of the stack. The method also includes encapsulating the plurality of exposed copper routing circuits at the bottom of the stack with a second insulation layer, and performing a cut-through procedure to singulate the semiconductor packages from each other.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Embodiments of the present invention are directed to a method of manufacturing a semiconductor package with an internal routing circuit. The internal routing circuit is formed from multiple leadframe routing layers in a plated and etched copper terminal semiconductor package by removing unwanted areas of each leadframe to create conductive paths on an associated leadframe layer of the semiconductor package.

Figure 1A:
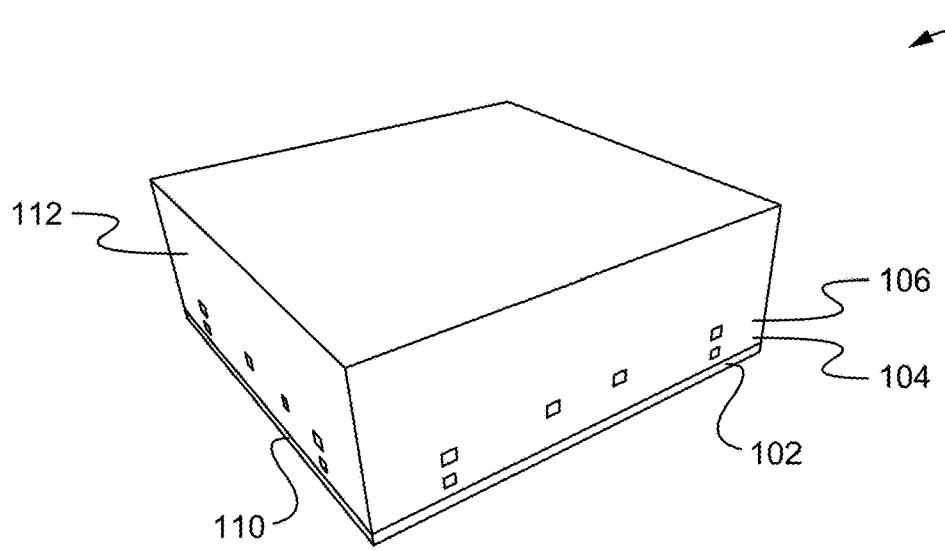
FIG. 1A illustrates an exemplary external view of a final singulated semiconductor package in accordance with some embodiments.
Figure 1B:
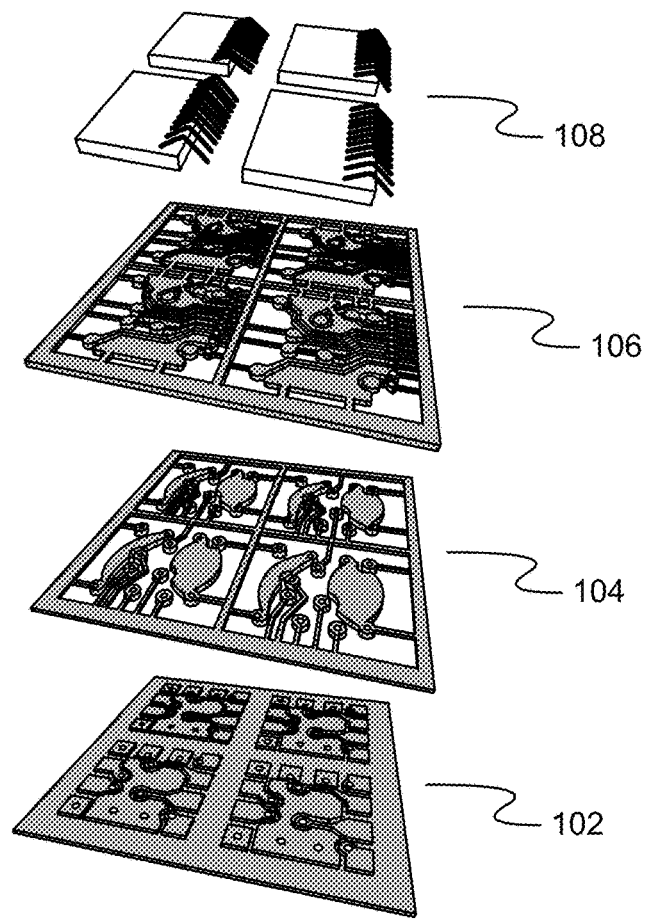
FIG. 1B illustrates an exemplary internal view of the semiconductor package of FIG. 1A in accordance with some embodiments.

FIG. 1A illustrates an exemplary external view of a final singulated semiconductor package (IC) 100 in accordance with some embodiments, while FIG. 1B illustrates an exemplary internal view of the semiconductor package 100, without molding compounds to show the structure of an internal routing circuit, in accordance with some embodiments. The internal routing circuit is formed from multiple leadframe routing path layers that are stacked in the semiconductor package 100. The internal routing circuit of the semiconductor package 100 provides for internal routing from die terminals of a semiconductor die 108 to a package terminals of the semiconductor package 100.

The semiconductor package 100, as shown, includes three leadframe routing path layers 102, 104, 106 electrically coupled either via material, such as solder paste, sintering epoxy, or the like, that is applied between the routing path layers 102, 104, 106, or by performing, for example, a spot welding process or a similar process. The leadframe routing path layers 102, 104, 106 form at least partially the internal routing circuit of the semiconductor package 100. However, it is noted that by the concepts discussed herein, more or less leadframe routing path layers can be formed within a semiconductor package. Typically, the topmost leadframe routing path layer (e.g., leadframe routing path layer 106) is physically and electrically coupled with at least one semiconductor die 108, while the bottommost leadframe routing path layer (e.g., leadframe routing path layer 102) is physically and electrically coupled with the package terminals. The leadframe routing path layer 102 is a part of a molding compound layer 110. The leadframe routing path layers 104, 106 and the die 108 are a part of a molding compound layer 112, which is distinct and separate from molding compound layer 110. In some embodiments, there are only two molding compound layers, with one encapsulating the bottommost leadframe routing path layer and another encapsulating all other leadframe routing path layers and at least one die. In some embodiments, each layer of the molding compound 110, 112 is visually indistinguishable from the other layers of the molding compound 110, 112. Alternatively, each layer of the molding compounds 110, 112 is visually distinguishable from the other layers of the molding compound 110, 112.

The bottommost leadframe routing path layer is a copper leadframe routing path layer and is referred herein as a base leadframe routing path layer. The topmost leadframe routing path layer is also a copper leadframe routing path layer and is referred herein as a top leadframe routing layer. Any leadframe routing path layer(s) between the base leadframe routing layer and the top leadframe routing layer is also a copper leadframe routing path layer and is referred to as an intermediary leadframe routing layer.

Figure 2:
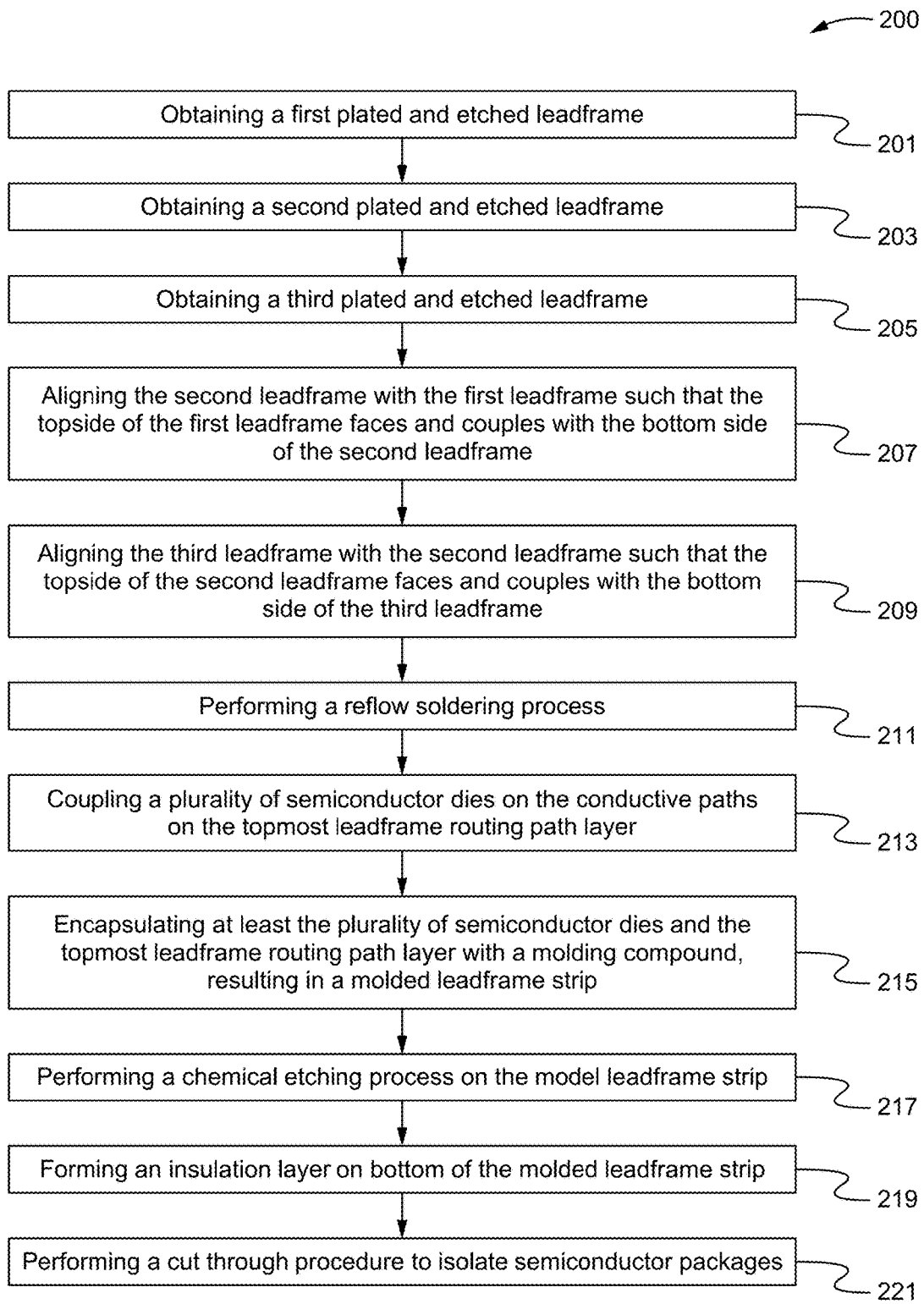
FIG. 2 illustrates an exemplary method of manufacturing a semiconductor package in accordance to some embodiments.
Figure 3A:
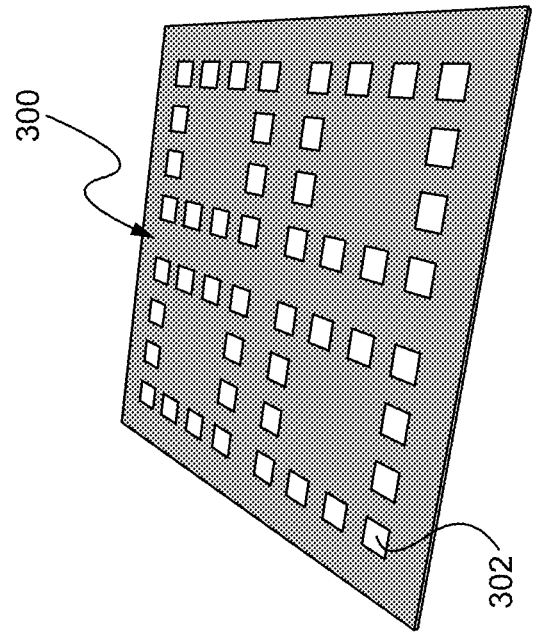
FIGS. 3A-3M illustrate an exemplary result produced at each step of the method of FIG. 2.
Figure 3A:
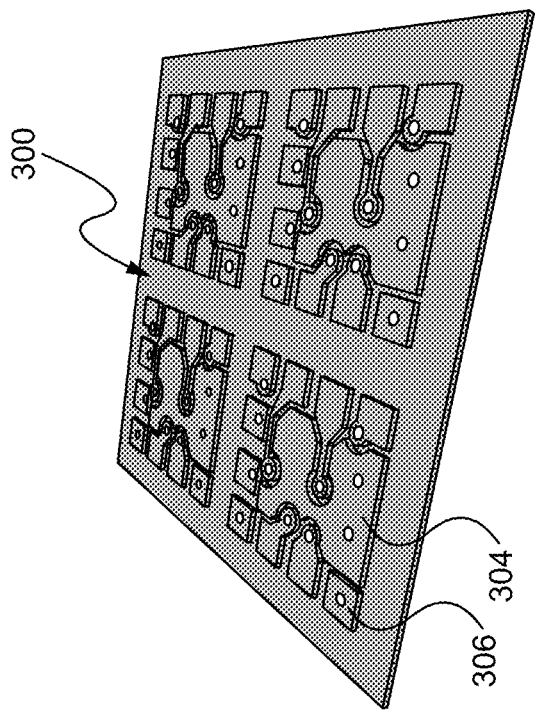
Figure 3B:
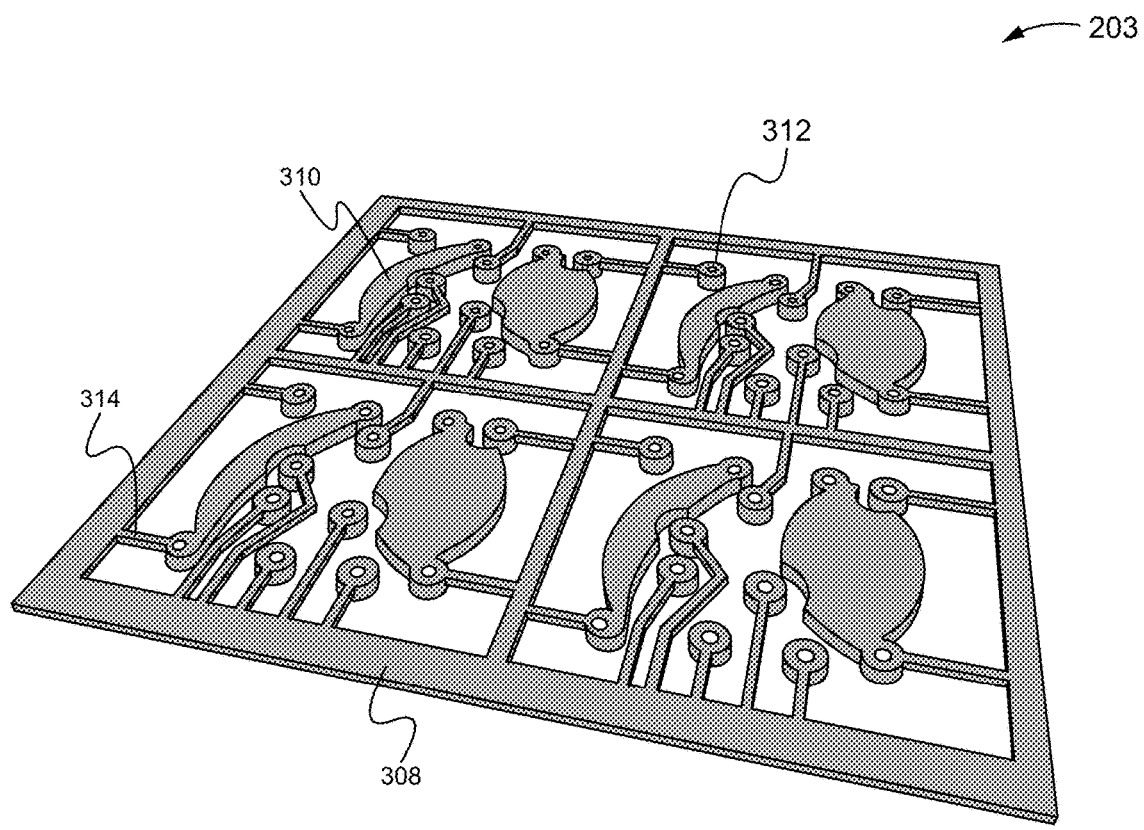
Figure 3C:
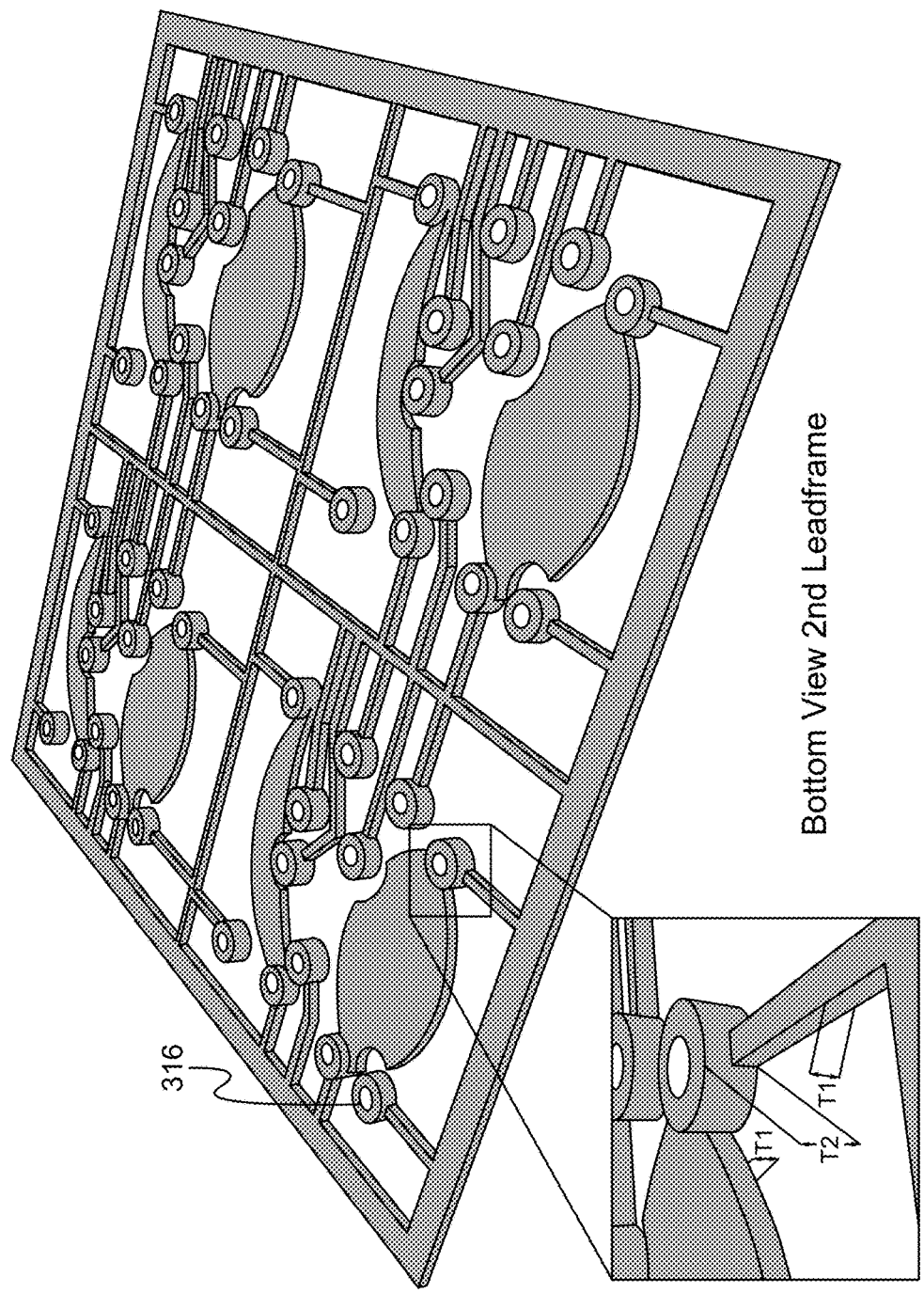
Figure 3D:
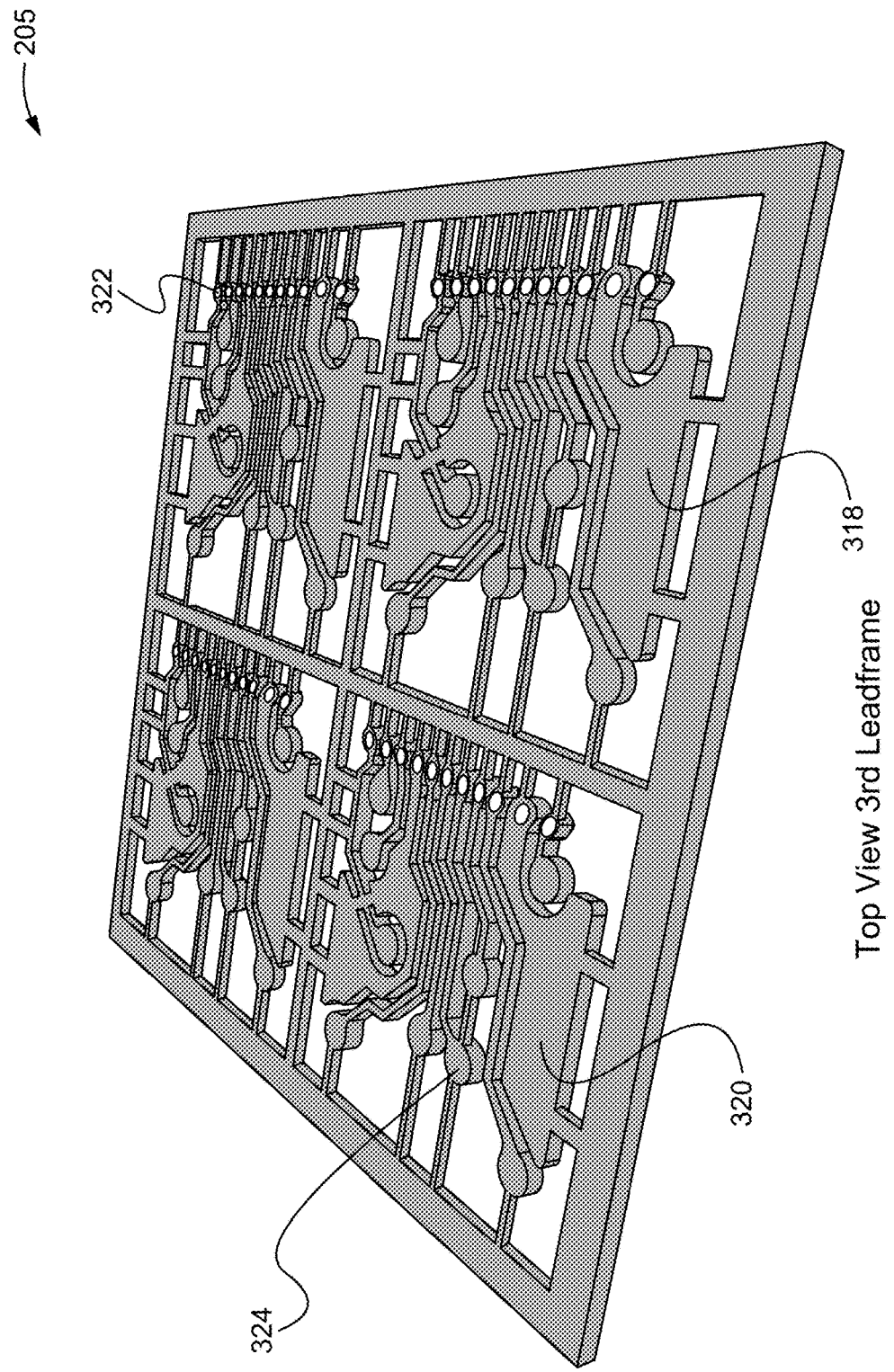
Figure 3E:
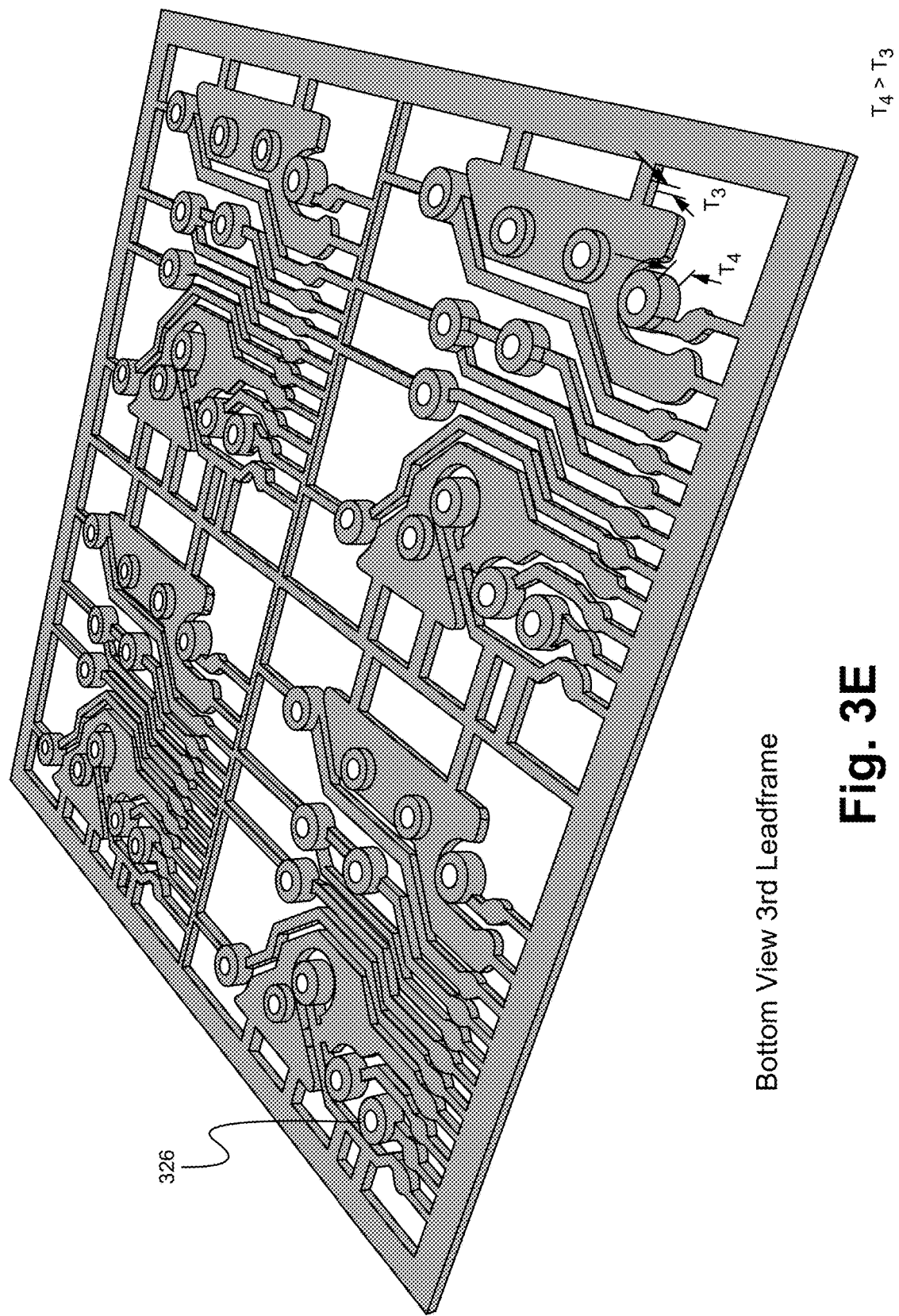
Figure 3F:
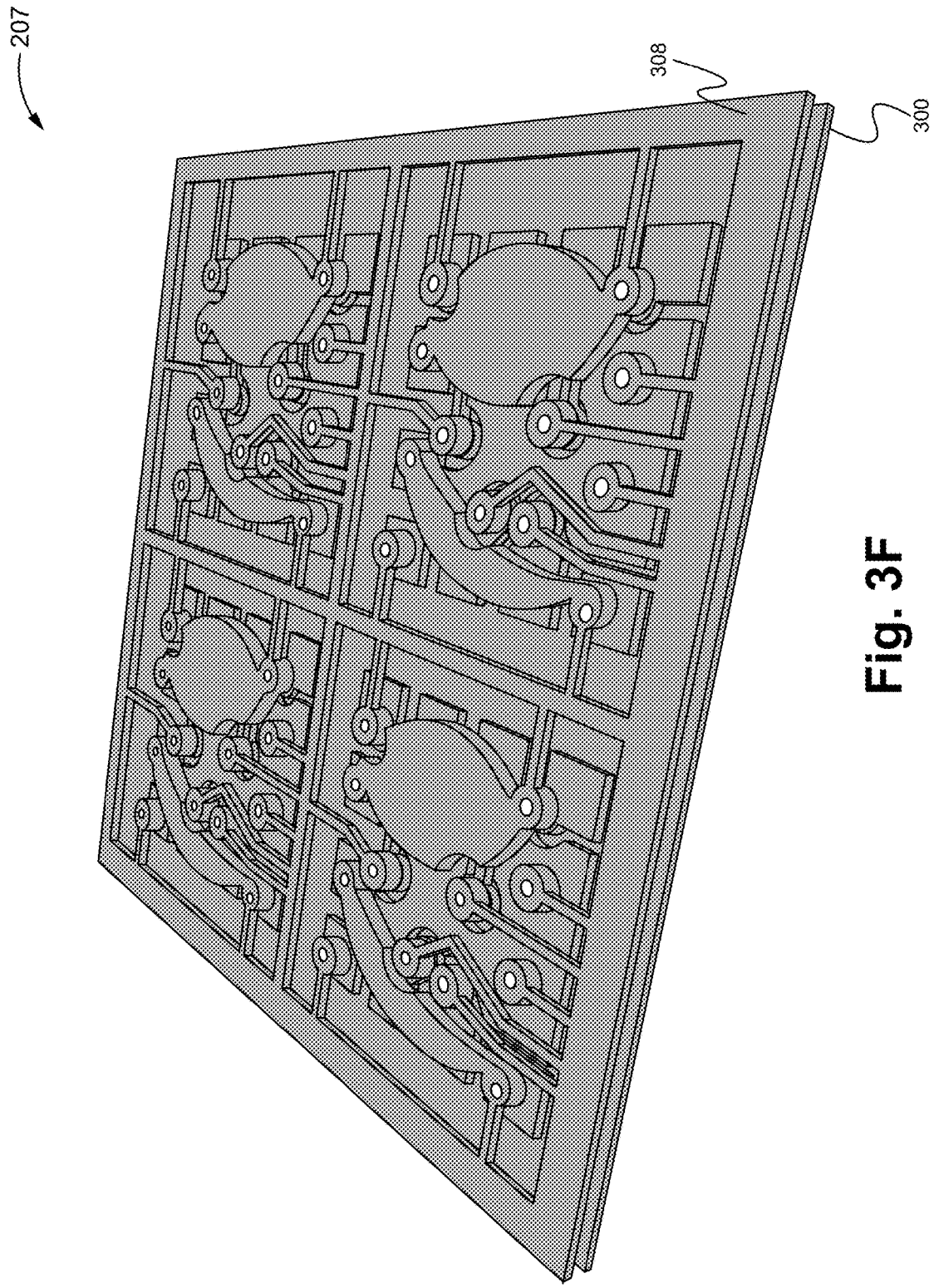
Figure 3G:
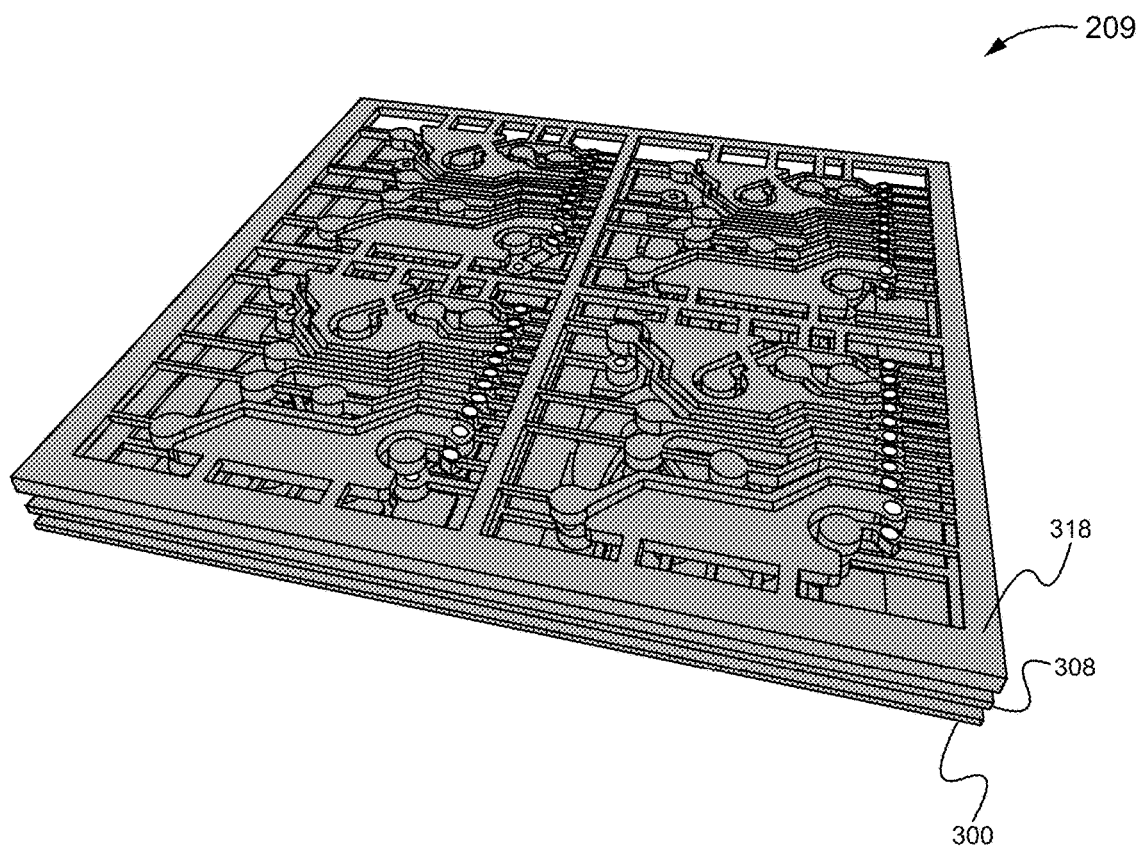
Figure 3H:
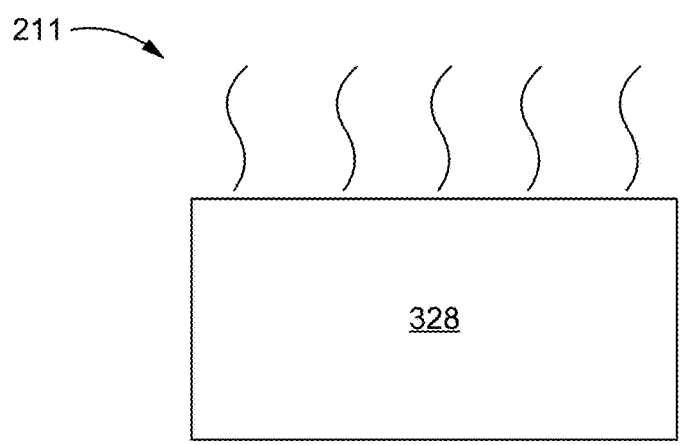
Figure 3I:
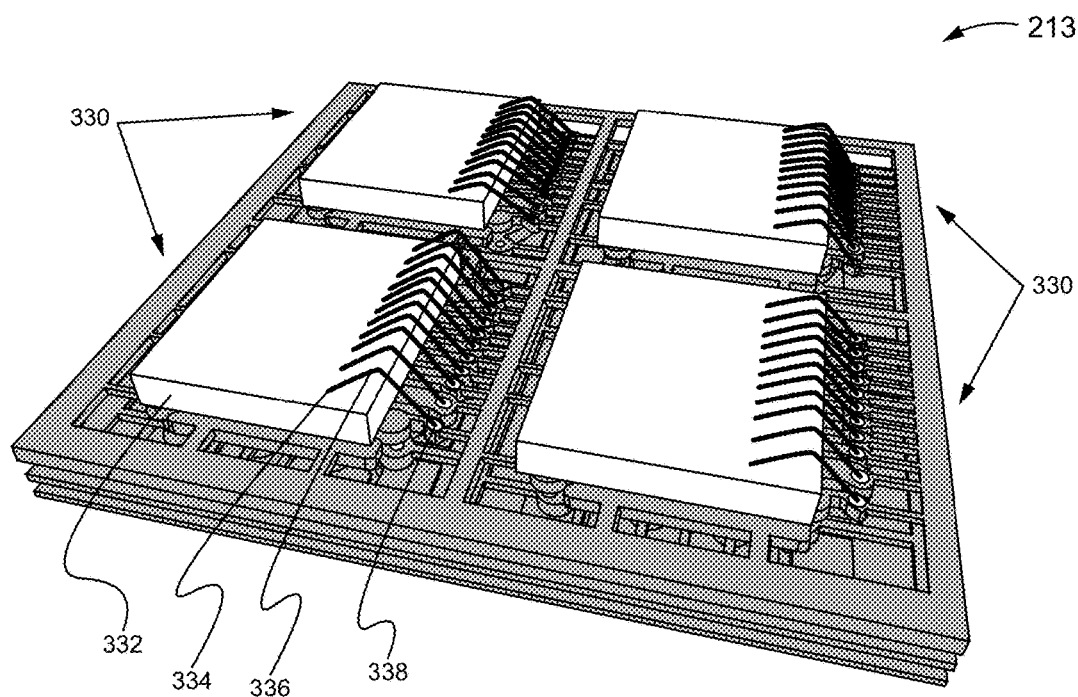
Figure 3J:
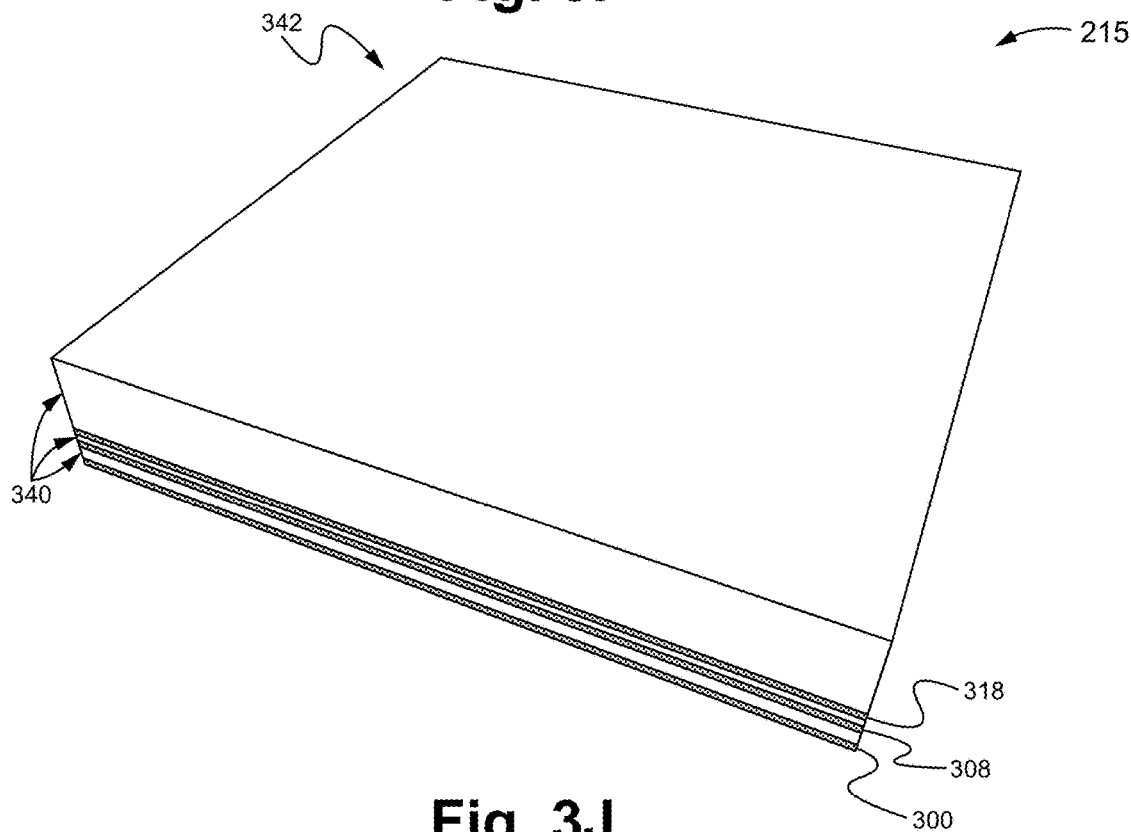
Figure 3K:
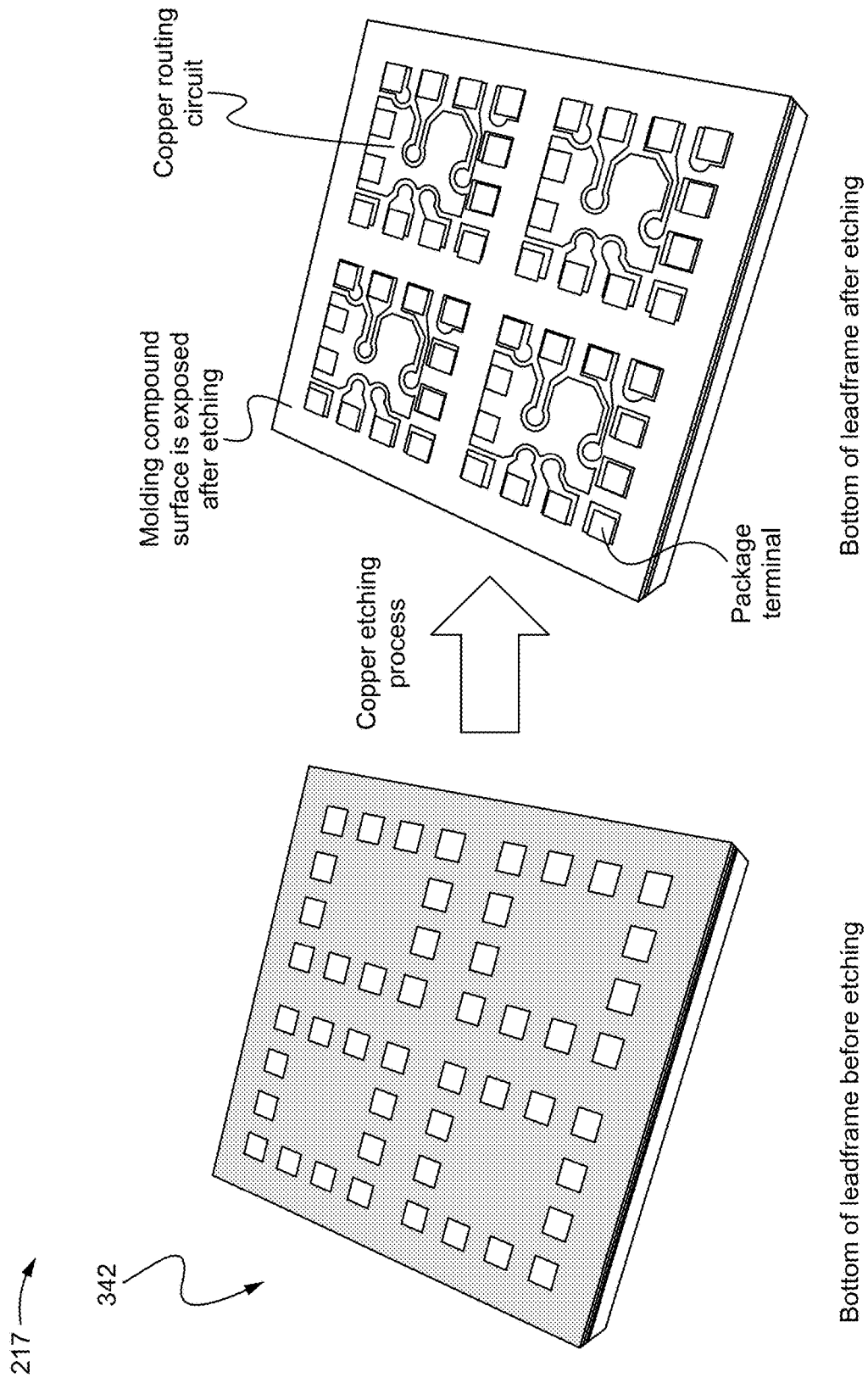
Figure 3L:
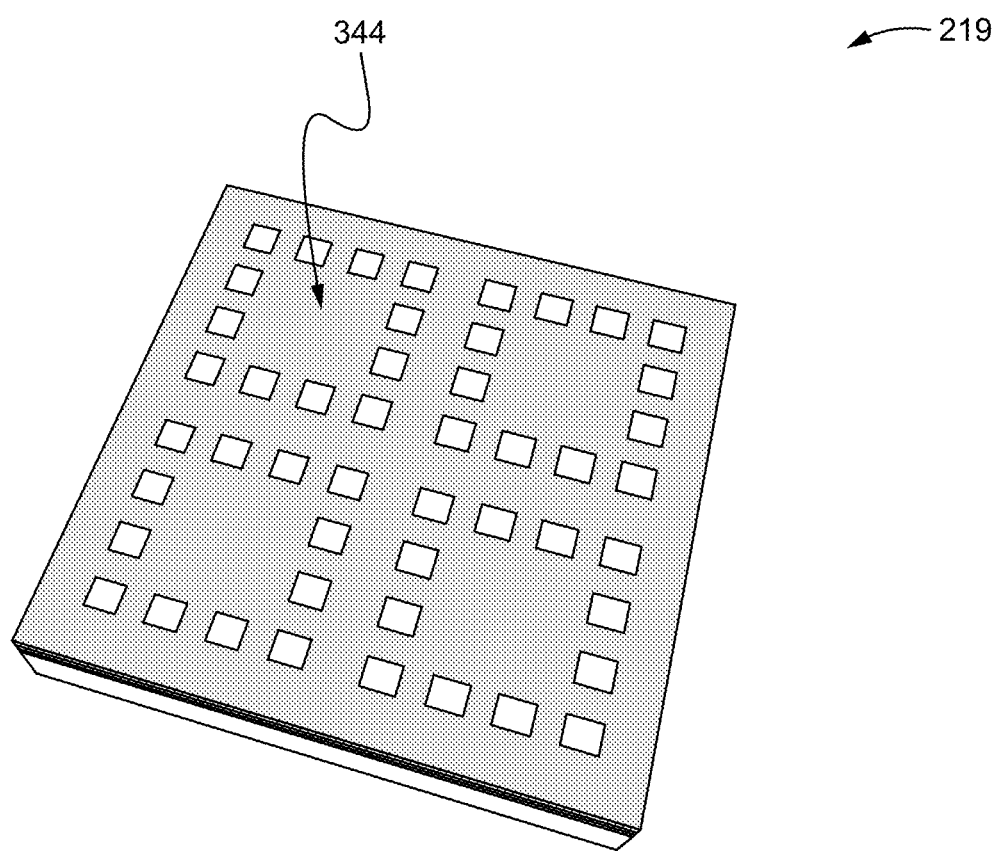
Figure 3M:
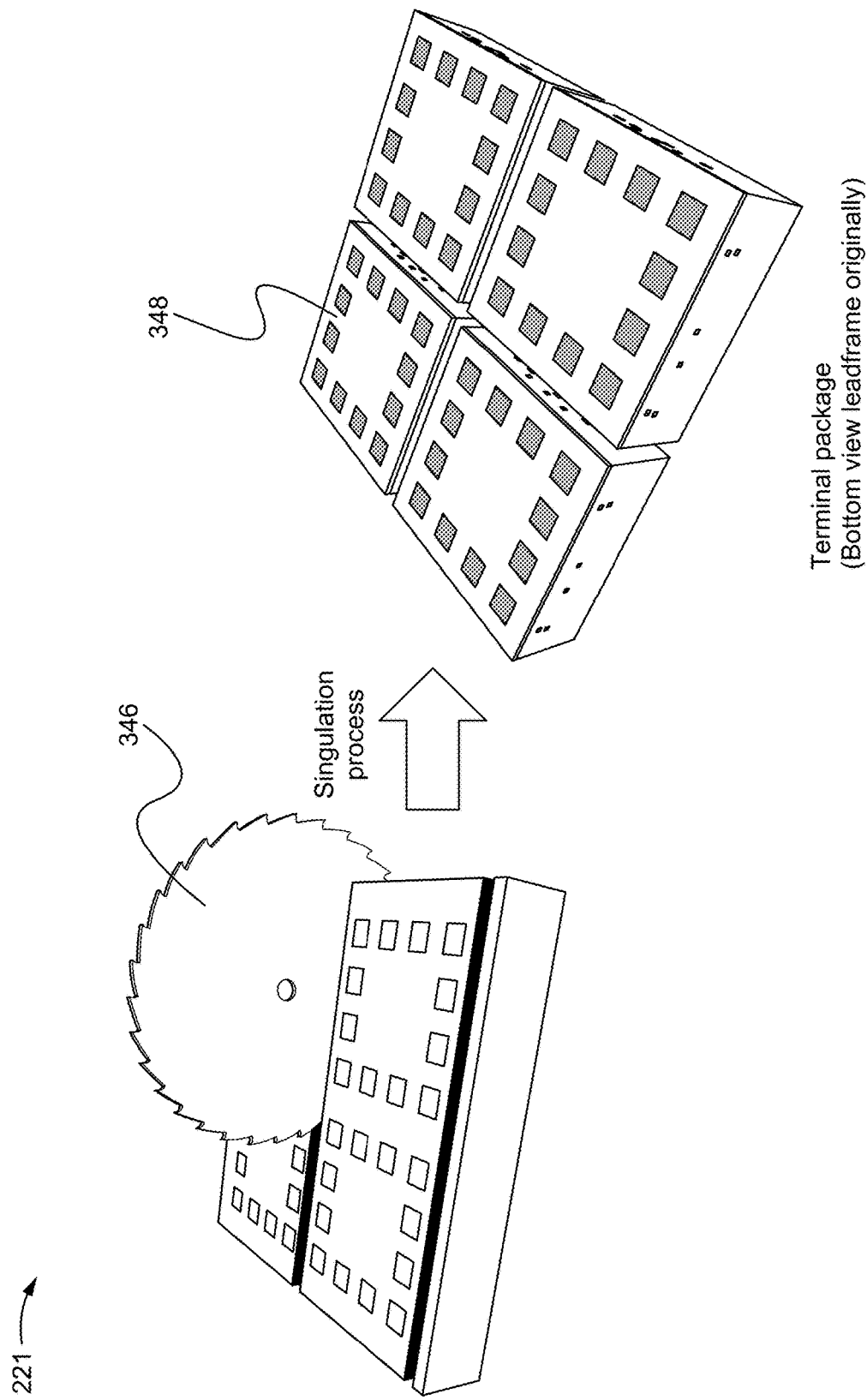

FIG. 2 illustrates an exemplary method 200 of manufacturing a semiconductor package in accordance with some embodiments. An exemplary result produced by each step of the method 200 is illustrated in FIGS. 3A-3M. Referring to FIGS. 2 and 3A-3M, the method 200 begins at a Step 201, where a first plated and etched leadframe 300 is obtained. In some embodiments, the first leadframe 300 is made from a solid copper sheet. The top side of the first leadframe 300 is etched away to form conductive paths 304 (also referred to copper routing circuits), which are included in the bottommost leadframe routing path layer 102 in FIG. 1B. A plurality of areas 306 on the top side of the first leadframe 300 is plated. The top plated areas 306 are connection locations to another leadframe. At least some of the top plated areas 306 are on the copper routing circuits 304. A plurality of areas 302 on the bottom side of the first leadframe 300 is also plated and forms package terminals. The number of bottom plated areas 302 is the same as the number of top plates areas 306, although the numbers can be different with the number of the bottom plated areas 302 being more or less than the number of the top plated areas 306. In some embodiments, the plating material is Ni+Pd+Au or any other suitable material(s).

At a Step 203, a second plated and etched leadframe 308 is obtained. In some embodiments, the second leadframe 308 is made from a solid copper sheet. The second leadframe 308 is fully etched away (etched-thru) to form conductive paths 310 (also referred to copper routing circuits), which are included in the next leadframe (e.g., $2^{nd}$) routing path layer 104 in FIG. 1B. Tie bars 314 couple the routing circuits 310 to the rest of the leadframe 308. A plurality of areas 312 on the top side of the second leadframe 308 is plated. The top plated areas 312 are connection locations to another leadframe. At least some of the top plated areas 312 are on the copper routing circuits 310. A plurality of areas 316 on the bottom side of the second leadframe 308 is also plated. The bottom plated areas 316 are connection locations to the first leadframe 300. These connection locations at the bottom side of the second leadframe 308 align with the connection locations of the first leadframe 300. At least some of the bottom plated areas 316 are on the copper routing circuits 310. The bottom plated areas 316 align with top plated areas 312. In some embodiments, the thickness of the connection locations is greater than the thickness of the rest of the copper routing circuits 310 and is also greater than the thickness of the tie bars 314. The differential in thicknesses results in "steps" formed at the connection locations and the tie bars 314, and in "steps" formed at the connection locations and the rest of the copper routing circuits 310. In some embodiments, these steps are located on the bottom side of the second leadframe 308. Alternatively or in addition to, steps are located on the top side of the second leadframe 308. The number of bottom plated areas 316 is the same as the number of top plated areas 312, although the numbers can be different with the number of the bottom plated areas 316 being more or less than the number of the top plated areas 312. In some embodiments, the plating material is Ni+Pd+Au or any other suitable material(s).

At a Step 205, a third plated and etched leadframe 318 is obtained. In some embodiments, the third leadframe 318 is made from a solid copper sheet. The third leadframe 318 is fully etched away (etched-thru) to form conductive paths 320 (also referred to copper routing circuits), which are included in the next leadframe (e.g., 3') routing path layer 106 in FIG. 1B. Tie bars 324 couple the routing circuits 320 to the rest of the leadframe 318. A plurality of areas 322 on the top side of the third leadframe 318 is plated. The top plated areas 322 are connection locations to a die. At least some of the top plated areas 322 are on the copper routing circuits 320. A plurality of areas 326 on the bottom side of the third leadframe 318 is also plated. The bottom plated areas 326 are connection locations to the second leadframe 308. These connection locations at the bottom side of the third leadframe 318 align with the connection locations at the top side of the second leadframe 308. At least some of the bottom plated areas 326 are on the copper routing circuits 310. The connection locations of the top plated areas 322 do not align with the connection locations of the bottom plated areas 326. In some embodiments, the connection locations of the top plated areas 322 form a line and are outside of a die mounting area. In some embodiments, the thickness of the connection locations of the bottom plated areas 326 is greater than the thickness of the rest of the copper routing circuits 320 and is also greater than the thickness of the tie bars 324. The differential in thicknesses results in "steps" formed at these connection locations and the tie bars 324, and formed at these connection locations and the rest of the copper routing circuits 320. In some embodiments, these steps are located on the bottom side of the third leadframe 318. Alternatively or in addition to, steps are located on the top side of the third leadframe 318. The connection locations of the bottom plated areas 326 correspond with connection locations of the top plated areas 312. The number of bottom plated areas 326 is different from the number of top plated areas 322, although the numbers can be the same as the number of the top plates areas 322. In some embodiments, the plating material is Ni+Pd+Au or any other suitable material(s).

In the case additional routing path layers are required, one or more plated and etched leadframes are obtained. In some embodiments, each of these leadframes is similarly formed as the second leadframe 308.

Figure 4A:
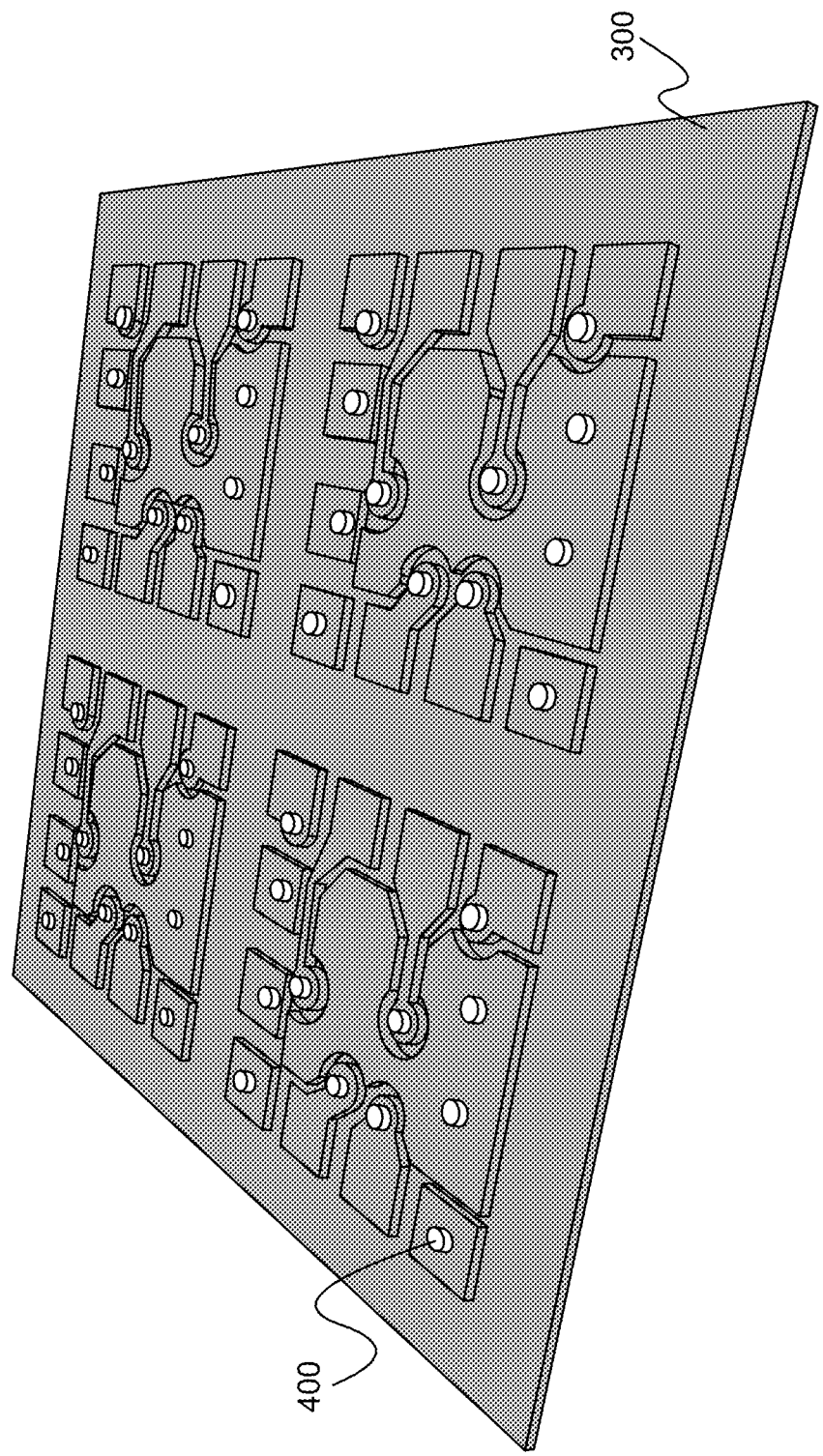
FIGS. 4A-4B illustrate additional steps of the method of FIG. 2.

At a Step 207, the second leadframe 308 is aligned with the first leadframe 300 via the connection locations on the interfacing sides of the first and second leadframes 300, 308 such that the topside of the first leadframe 300 faces and couples with the bottom side of the second leadframe 308. In some embodiments, the second leadframe 308 is electrically coupled with the first leadframe 300 via a spot welding method. Alternatively, the second leadframe 308 is electrically coupled with the first leadframe 300 via material 400 that is applied to the top plated areas 306 of the first leadframe 300, as illustrated in FIG. 4A, to thereby electrically couple the first leadframe 300 with the second leadframe 308. In some embodiments, the material 400 can be solder paste, silver (Ag) sintering epoxy or the like.

Figure 4B:
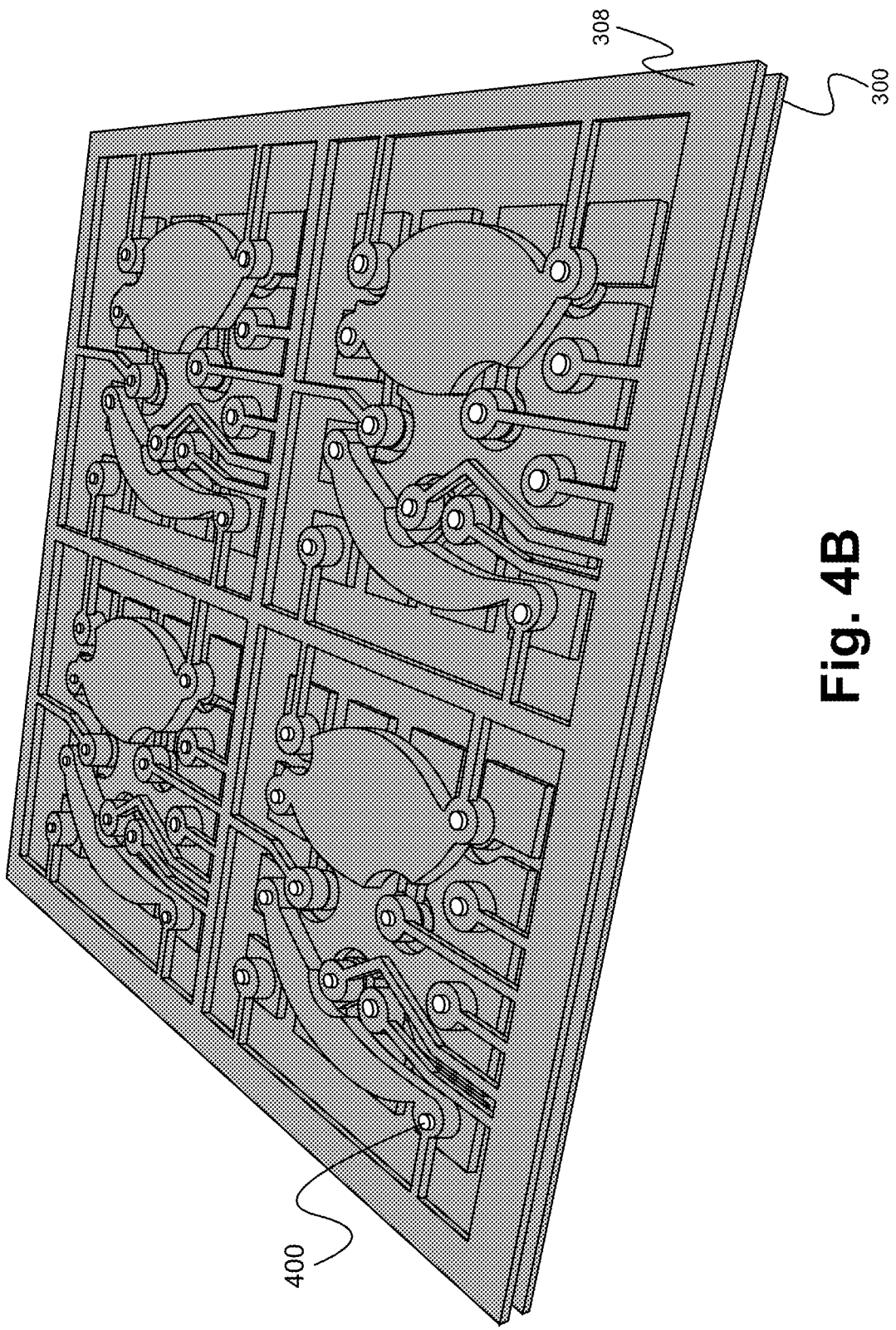

At a Step 209, the third leadframe 318 is aligned with the second leadframe 308 via the connection locations on the interfacing sides of the second and third leadframes 308, 318 such that the topside of the second leadframe 308 faces and couples with the bottom side of the third leadframe 318. In some embodiments, the third leadframe 318 is electrically coupled with the second leadframe 308 via a spot welding method. Alternatively, the third leadframe 318 is electrically coupled with the second leadframe 308 via the material 400 that is applied to the top plated areas 312 of the second leadframe 308, as illustrated in FIG. 4B, to thereby electrically couple the second leadframe 308 with the third leadframe 318.

It should be noted that the steps of gathering the individual leadframes and stacking/coupling them can be performed in a different order than the one outlined above. For example, each obtained leadframe can be first stacked and coupled to another prior to obtaining a subsequent leadframe.

At a Step 211, after all the leadframes are stacked, a reflow soldering process is performed on the stacked leadframes to permanently couple the jointed connection points between each leadframe. In some embodiments, the stacked leadframes are placed in a reflow oven 328.

At a Step 213, a plurality of semiconductor dies 332 is coupled on the conductive paths on the topmost leadframe routing path layer (e.g., the topmost leadframe routing path layer 106 in FIG. 1B) using epoxy, with at least one semiconductor die 332 in each IC packaging section 330. In some embodiments, wire bonds 336 electrically couple electrical pads 334 on the dies 332 and pads 338 on a molding compound layer. The pads 338 are the connection locations of top plated areas associated with the topmost routing path layer (e.g., connection locations of the top plated areas 312).

At a Step 215, at least the plurality of semiconductor dies 334 and the topmost conductive routing path layer are encapsulated with a molding compound 340, resulting in a molded leadframe strip 342.

At a Step 217, a chemical etching process, such as a copper chemical etching dip process or a copper chemical etching spray process, is performed on the molded leadframe strip 342. At the bottom of the molded leadframe strip 342, the copper surface that is covered with the pre-plated metal from the Step 201 is not etched away, while the copper surface that is not covered with the pre-plated metal from the Step 201 is etched away. The chemical etching process reacts with the copper until it reaches the molding compound 340. After the copper is removed, the package terminals are isolated from each other and the copper routing circuits 304 of the first routing path layer is revealed at the bottom of the molded leadframe strip 342.

At a Step 219, an insulation layer 344 is formed on bottom of the molded leadframe strip 342 such that the copper routing circuits 304 is covered but the package terminals are exposed. In some embodiments, the package terminals are flush with the insulation layer 344. Alternatively, the package terminals protrude from the insulation layer 344. The insulation layer 34 protects the copper routing circuits 304 from causing issues with its environment, such as in a printed circuit board.

At a Step 221, a cut through procedure is performed to isolate semiconductor packages 348 from the leadframe 342. A tool 346, such as a saw, is used to fully cut the leadframe along the singulation paths. Each semiconductor package 348 is similarly configured as the semiconductor package 100.

A semiconductor package, such as the singulated semiconductor package 348, includes package terminals at a bottom side of the semiconductor package, and a plurality of copper leadframe routing layers, including a base copper leadframe routing layer and a top copper leadframe routing layer, within the semiconductor package.

The base copper leadframe routing layer includes base copper routing circuits. The base copper leadframe routing layer is a base copper leadframe that is partially etched on a first side on the base copper leadframe to form the base copper routing circuits, and is plated on a second side of the base copper leadframe to form the package terminals.

The top copper leadframe routing layer includes top copper routing circuits. The top copper leadframe routing layer is a top copper leadframe that is etched-thru to form the top copper routing circuits. In some embodiments, the top copper leadframe includes steps formed on a bottom side of the top copper leadframe.

In some embodiments, the copper routing circuits associated with each routing layer is structured differently from the routing circuits associated with other routing layers.

The plurality of copper leadframe routing layers can also include at least one intermediary copper leadframe routing layer. Each of the at least one intermediary copper leadframe routing layer is an intermediary copper leadframe that is etch-thru to form intermediary copper routing circuits. In some embodiments, each of the at least one intermediary copper leadframe includes steps formed on a bottom side of the intermediary copper leadframe.

The semiconductor package also includes a die coupled with the top copper leadframe routing layer, a first insulation layer encapsulating the die and top copper leadframe routing layer and all intermediary copper leadframe routing layer, if any, and a second insulation layer encapsulating the base copper leadframe routing layer, wherein the package terminals are exposed at and flush with a bottom of the second insulation layer.

In some embodiments, each of the top copper leadframe routing layer and the intermediary copper leadframe routing layers, if any, further includes tie bars extending from corresponding copper routing circuits associated with the routing layer. The tie bars are exposed at and flush with sides of the first insulation layer.

The semiconductor package includes an internal routing circuit from die terminals on the die to the package terminals. The internal routing circuit is formed by all the routing layers in the semiconductor package.

Figure 5:
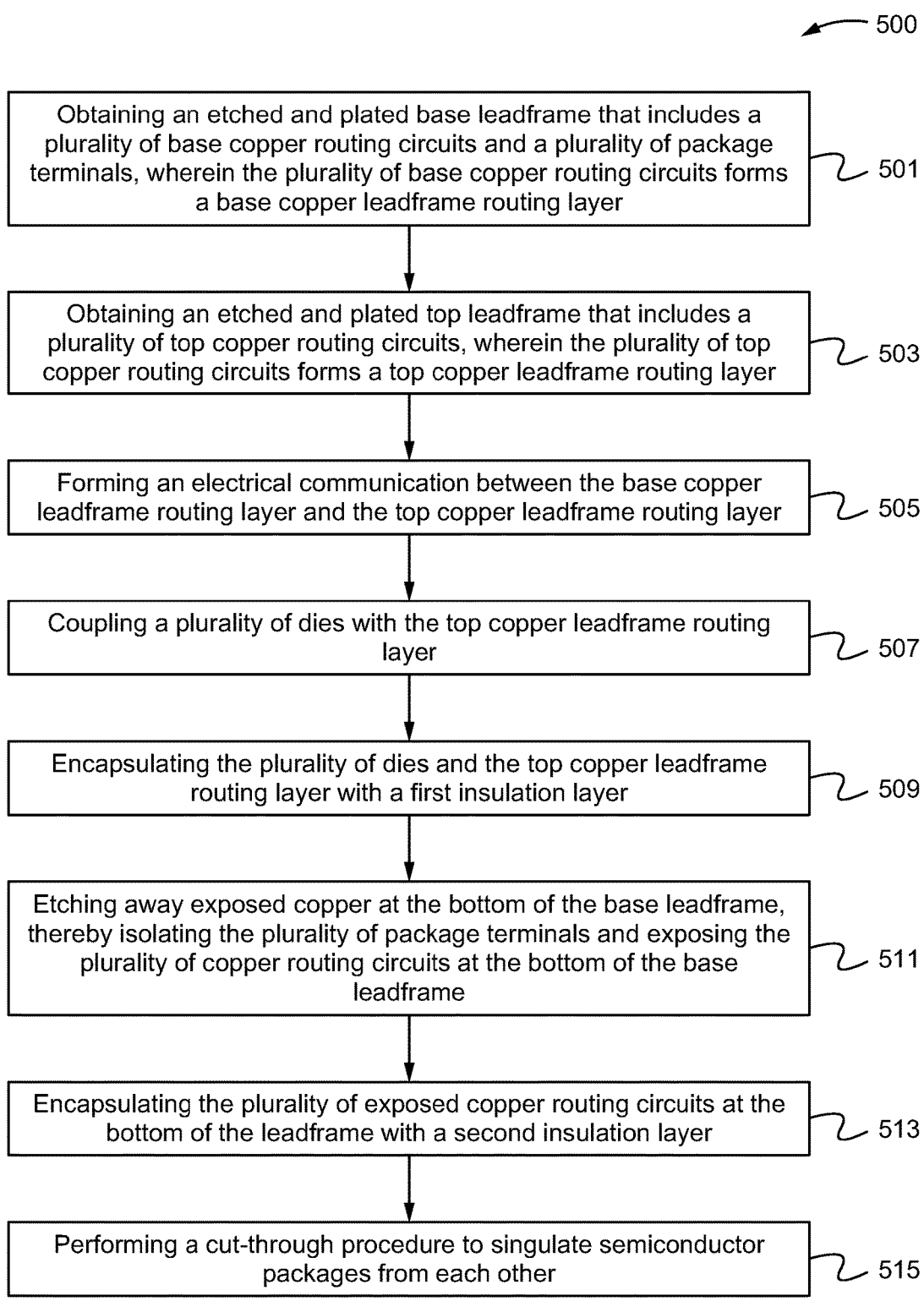
FIG. 5 illustrates an exemplary method of manufacturing semiconductor devices that each includes a plurality of conductive routing layers accordance with some embodiments.

FIG. 5 illustrates an exemplary method 500 of manufacturing semiconductor devices that each includes a plurality of conductive routing layers in accordance with some embodiments. The method 500 begins at a Step 501, where an etched and plated base leadframe is obtained. The etched and plated base leadframe includes a plurality of base copper routing circuits and a plurality of package terminals. The plurality of base copper routing circuits forms a base copper leadframe routing layer. In some embodiments, the etched and plated base leadframe is obtained by partially etching a base copper substrate to form the plurality of base copper routing circuits at a top surface of the base copper substrate, and plating a plurality of areas on surfaces of the base copper substrate, thereby resulting in the etched and plated base leadframe. The plurality of areas includes bottom plated areas that eventually form the plurality of package terminals and also includes top plated areas.

At a Step 503, an etched and plated top leadframe is obtained. The etched and plated top leadframe includes a plurality of top copper routing circuits. The plurality of top copper routing circuits forms a top copper leadframe routing layer. In some embodiments, the etched and plated top leadframe is obtained by fully etching a top copper substrate to form the plurality of top copper routing circuits and tie bars, wherein the plurality of top copper routing circuits is suspended by the tie bars, and plating a plurality of areas on surfaces of the top copper substrate, thereby resulting in the etched and plated top leadframe. The plurality of areas includes bottom plated areas and top plated areas that are on opposite sides of the top copper substrate, wherein the bottom plated areas of the top copper substrate are configured to interface with top plated areas of a leadframe directly beneath the etched and plated top leadframe. The top plated areas of the top copper substrate are configured to couple with the plurality of dies.

In some embodiments, after the Step 501 and before the Step 503, an etched and plated intermediary leadframe is obtained. The etched and plated intermediary leadframe includes a plurality of intermediary copper routing circuits. The plurality of intermediary copper routing circuits forms an intermediary copper leadframe routing layer. In some embodiments, the etched and plated top leadframe is obtained by fully etching an intermediary copper substrate to form the plurality of intermediary copper routing circuits and tie bars, wherein the plurality of intermediary routing circuits is suspended by the tie bars, and plating a plurality of areas on surfaces of the intermediary copper substrate, thereby resulting in the etched and plated intermediary leadframe. The plurality of areas includes bottom plated areas and top plated areas that are on opposite sides of the intermediary copper substrate, wherein the bottom plated areas of the intermediary copper substrate are configured to interface with top plated areas of a leadframe directly beneath the etched and plated intermediary leadframe. The top plated areas of the intermediary copper substrate are configured to couple with bottom plated areas of a leadframe directly above the etched and plated intermediary leadframe.

At a Step 505, an electrical communication is formed between the base copper leadframe routing layer and the top copper leadframe routing layer, including the intermediary copper leadframe routing layer if present. The electrical connection can be formed by applying material, such as solder paste, sintering epoxy, or the like, between the routing path layers. Alternatively, the electrical connection can be formed by performing a spot welding process. If a spot welding process is performed, it is not necessary to apply solder paste or sintering epoxy between the routing path layers prior to joining one routing path layer to another, although the material can be applied between the routing path layers prior to joining one routing path layer to another.

At a Step 507, a plurality of dies is coupled with the top copper leadframe routing layer.

At a Step 509, the plurality of dies and the top copper leadframe routing layer are encapsulated with a first insulation layer. The first insulation layer also encapsulates the intermediary copper leadframe routing layer if present.

At a Step 511, exposed copper at the bottom of the base leadframe is etched away, thereby isolating the plurality of package terminals and exposing the plurality of copper routing circuits at the bottom of the base leadframe.

At a Step 513, the plurality of exposed copper routing circuits at the bottom of the leadframe is encapsulated with a second insulation layer.

At a Step 515, a cut-through procedure is performed to singulate the semiconductor packages from each other.

It is noted that the demonstration discussed herein is on a semiconductor package with three conductive routing path layers. However, by the concept of this invention, it is possible to obtain more copper leadframe routing layers to stack on each other such that a final semiconductor package can have more than three conductive routing path layers.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A method of manufacturing semiconductor devices that each includes a plurality of conductive routing layers, comprising:
    obtaining an etched and plated base leadframe that includes a plurality of base copper routing circuits and a plurality of package terminals, wherein the plurality of base copper routing circuits forms a base copper leadframe routing layer;
    obtaining an etched and plated top leadframe that includes a plurality of top copper routing circuits, wherein the plurality of top copper routing circuits forms a top copper leadframe routing layer;
    forming an electrical communication between the base copper leadframe routing layer and the top copper leadframe routing layer;
    coupling a plurality of dies with the top copper leadframe routing layer;
    encapsulating the plurality of dies and the top copper leadframe routing layer with a first insulation layer;
    etching away exposed copper at the bottom of the base leadframe, thereby isolating the plurality of package terminals and exposing the plurality of base copper routing circuits at the bottom of the base leadframe;
    encapsulating the plurality of exposed copper routing circuits at the bottom of the base leadframe with a second insulation layer; and
    performing a cut-through procedure to singulate the semiconductor packages from each other.

2. The method of claim 1, wherein obtaining an etched and plated base leadframe includes:
    partially etching a base copper substrate to form the plurality of base copper routing circuits at a top surface of the base copper substrate; and
    plating a plurality of areas on surfaces of the base copper substrate, thereby resulting in the etched and plated base leadframe, wherein the plurality of areas includes bottom plated areas that eventually form the plurality of package terminals and also includes top plated areas.

3. The method of claim 2, wherein obtaining an etched and plated top leadframe includes:

fully etching a top copper substrate to form the plurality of top copper routing circuits and tie bars, wherein the plurality of top copper routing circuits is suspended by the tie bars; and plating a plurality of areas on surfaces of the top copper substrate, thereby resulting in the etched and plated top leadframe, wherein the plurality of areas includes bottom plated areas and top plated areas that are on opposite sides of the top copper substrate, wherein the bottom plated areas of the top copper substrate are configured to interface with top plated areas of a leadframe directly beneath the etched and plated top leadframe, and wherein the top plated areas of the top copper substrate are configured to couple with the plurality of dies.

4. The method of claim 3, further comprising, prior to forming an electrical communication between the base copper leadframe routing layer and the top copper leadframe routing layer:

obtaining an etched and plated intermediary leadframe that includes a plurality of intermediary copper routing circuits, wherein the plurality of intermediary copper routing circuits forms an intermediary copper leadframe routing layer; and forming an electrical communication between the base copper leadframe routing layer and the intermediary copper leadframe routing layer.

5. The method of claim 4, wherein obtaining an etched and plated intermediary leadframe includes:

fully etching an intermediary copper substrate to form the plurality of intermediary copper routing circuits and tie bars, wherein the plurality of intermediary copper routing circuits is suspended by the tie bars; and plating a plurality of areas on surfaces of the intermediary copper substrate, thereby resulting in the etched and plated intermediary leadframe, wherein the plurality of areas includes bottom plated areas and top plated areas that are on opposite sides of the intermediary copper substrate, wherein the bottom plated areas of the intermediary copper substrate are configured to interface with top plated areas of a leadframe directly beneath the etched and plated intermediary leadframe, and wherein the top plated areas of the intermediary copper substrate are configured to couple with bottom plated areas of a leadframe directly above the etched and plated intermediary leadframe.

6. The method of claim 5, wherein the first insulation layer also encapsulates the intermediary copper leadframe routing layer.

7. The method of claim 6, wherein the electrical connections between the routing layers are formed using material, wherein the material is solder paste or sintering epoxy.

8. The method of claim 6, wherein the electrical connections between the routing layers are formed by performing a spot welding process.

9. A method of manufacturing semiconductor devices that each includes a plurality of conductive routing layers, comprising:

obtaining a plurality of etched leadframes, wherein each of the etched leadframes includes a plurality of routing circuits that forms a leadframe routing layer;

stacking the plurality of etched leadframes, thereby forming an internal routing circuit from all leadframe routing layers;

coupling a plurality of dies with the topmost leadframe routing layer of the stack;

encapsulating the plurality of dies and all leadframe routing layers, except the bottommost leadframe routing layer of the stack, with a first insulation material;

removing exposed copper at the bottom of the stack, thereby isolating a plurality of package terminals and exposing a plurality of copper routing circuits at the bottom of the stack;

encapsulating the plurality of exposed copper routing circuits at the bottom of the stack with a second insulation material; and performing a cut-through procedure to singulate the semiconductor packages from each other.

10. The method of claim 9, wherein the plurality of etched leadframes include:

a base etched leadframe that is not etched-thru, wherein the plurality of routing circuits of the base etched leadframe is formed on a top surface of the base etched leadframe and includes a plurality of connection locations, wherein the thickness of the base etched leadframe at the plurality of plurality of routing circuits of the base etched leadframe is thicker than other portions of the base etched leadframe; and an etched-thru top etched leadframe, wherein the plurality of routing circuits of the top etched leadframe includes a plurality of connection locations, wherein the thickness of the plurality of routing circuits of the top etched leadframe at the plurality of connection locations is thicker than other portions of the plurality of routing circuits of the top etched leadframe.

11. The method of claim 10, wherein the plurality of etched leadframes further includes at least one etched-thru intermediary etched leadframe, wherein the plurality of routing circuits of the intermediary etched leadframe includes a plurality of connection locations, wherein the thickness of the plurality of routing circuits of the intermediary etched leadframe at the plurality of connection locations is thicker than other portions of the plurality of routing circuits of the intermediary etched leadframe.

12. The method of claim 11, wherein each of the plurality of etched leadframes in the stack is stacked such that a current etched leadframe is directly coupled with an adjacent etch leadframe that is directly beneath the current etched leadframe routing layer and only at joined connection points formed by aligned connection locations of the current and the adjacent etched leadframes.

13. The method of claim 12, further comprising, after stacking the plurality of etched leadframes and before coupling a plurality of dies, performing a reflow soldering process.

14. The method of claim 13, wherein removing the exposed copper at the bottom of the stack also exposes the first insulation material from the bottom of the stack.

* * * * *